United States Patent
Chui et al.

(10) Patent No.: US 7,629,603 B2
(45) Date of Patent: Dec. 8, 2009

(54) STRAIN-INDUCING SEMICONDUCTOR REGIONS

(75) Inventors: Chi On Chui, San Mateo, CA (US); Prashant Majhi, Austin, TX (US); Wilman Tsai, Saratoga, CA (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 11/450,744

(22) Filed: Jun. 9, 2006

(65) Prior Publication Data

US 2007/0284613 A1    Dec. 13, 2007

(51) Int. Cl.
 *H01L 31/00*    (2006.01)
(52) U.S. Cl. .................. 257/18; 257/254; 257/417; 257/E29.193; 257/213
(58) Field of Classification Search .............. 257/18, 257/254, 417, E29.193, 213
See application file for complete search history.

(56) References Cited

U.S. PATENT DOCUMENTS

| | | | | |
|---|---|---|---|---|
| 5,872,023 A * | 2/1999 | Shiraishi et al. | ........... | 438/46 |
| 5,986,287 A * | 11/1999 | Eberl et al. | ........... | 257/77 |
| 6,541,788 B2 * | 4/2003 | Petroff et al. | ........... | 257/21 |
| 6,621,131 B2 | 9/2003 | Murthy et al. | | |
| 6,639,249 B2 * | 10/2003 | Valliath | ........... | 257/88 |
| 6,861,318 B2 | 3/2005 | Murthy et al. | | |
| 6,885,084 B2 | 4/2005 | Murthy et al. | | |
| 6,909,151 B2 | 6/2005 | Hareland et al. | | |
| 6,960,781 B2 | 11/2005 | Currie et al. | | |
| 6,974,738 B2 | 12/2005 | Hareland et al. | | |
| 7,358,551 B2 * | 4/2008 | Chidambarrao et al. | ..... | 257/288 |
| 2003/0052406 A1 * | 3/2003 | Lochtefeld et al. | ......... | 257/717 |
| 2004/0084735 A1 * | 5/2004 | Murthy et al. | ......... | 257/408 |
| 2004/0173815 A1 * | 9/2004 | Yeo et al. | ......... | 257/192 |

* cited by examiner

*Primary Examiner*—Minh-Loan T Tran
*Assistant Examiner*—Fei Fei Yeung Lopez
(74) *Attorney, Agent, or Firm*—Blakely, Sokoloff, Taylor & Zafman LLP

(57) ABSTRACT

A method to form a strain-inducing semiconductor region comprising three or more species of charge-neutral lattice-forming atoms is described. In one embodiment, formation of a strain-inducing semiconductor region, comprising three or more species of charge-neutral lattice-forming atoms, laterally adjacent to a crystalline substrate results in a uniaxial strain imparted to the crystalline substrate. Thus, a strained crystalline substrate may be provided. In another embodiment, a semiconductor region with a crystalline lattice of three or more species of charge-neutral lattice-forming atoms imparts a strain to a crystalline substrate, wherein the lattice constant of the semiconductor region is different from that of the crystalline substrate.

22 Claims, 12 Drawing Sheets

US 7,629,603 B2

STRAIN-INDUCING SEMICONDUCTOR REGIONS

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of strained silicon regions into the active portions of a semiconductor substrate, e.g. the use of compressively strained silicon channel regions to enhance hole mobility in P-type Metal Oxide Semiconductor Field-Effect Transistors (PMOS-FETs). The presence of such strained silicon regions may greatly enhance the rate at which charge migrates in a channel when a semiconductor is in an ON state.

FIG. 1 depicts a typical strained PMOS-FET 100 fabricated on a substrate 102. A gate dielectric layer 104 sits above a channel region 106 and a gate electrode 108 sits above gate dielectric layer 104. Gate dielectric layer 104 and gate electrode 108 are isolated by gate isolation spacers 110. Tip extensions 112 are formed by implanting dopant atoms into substrate 102. Strain-inducing source/drain regions 120 are formed by selectively growing an epitaxial film in etched-out portions of substrate 102 and are doped either in situ or after epitaxial film growth, or both. In typical PMOS-FETs, the channel region 106 is comprised of crystalline silicon, while the strain-inducing source/drain regions 120 are comprised of epitaxial silicon/germanium which has a larger lattice constant than that of crystalline silicon. Strain-inducing source/drain regions 120 can impart a uniaxial compressive strain to the channel region 106. Such a compressive strain can enhance the hole mobility in channel region 106 of PMOS-FET 100, lending to improved performance of the device.

FIGS. 2A-C illustrate a typical process flow for forming strain-inducing silicon/germanium source/drain regions in a PMOS-FET. Referring to FIG. 2A, a non-strained PMOS-FET 200 is first formed. Non-strained PMOS-FET 200 is comprised of a channel region 206. A gate dielectric layer 204 sits above the channel region 206 and a gate electrode 208 sits above gate dielectric layer 204. Gate dielectric layer 204 and gate electrode 208 are isolated by gate isolation spacer 210. Tip extensions 212 and source/drain regions 214 are formed by implanting dopant atoms into substrate 202. Thus, the source/drain regions 214 are initially formed from the same material as the channel region 206. Therefore, the lattice mismatch between the source/drain regions 214 and the channel region 206 is negligible, resulting in effectively no strain on the channel region 206.

Referring to FIG. 2B, portions of substrate 202, including source/drain regions 214, are removed, e.g. by an etch process, to form recessed regions 216 in substrate 202. Subsequently, strain-inducing silicon/germanium source/drain regions 220 are formed by selectively growing an epitaxial film into recessed regions 216, as depicted in FIG. 2C. Strain-inducing silicon/germanium source/drain regions 220 can be doped with charge-carrier atoms, e.g. boron in the case of a PMOS-FET, which may be done in situ or after epitaxial film growth, or both. In an example, substrate 202, and hence channel region 206, is comprised of crystalline silicon and the film grown to form strain-inducing source/drain regions 220 is comprised of epitaxial silicon/germanium. The lattice constant of the epitaxial silicon/germanium film can be greater than that of crystalline silicon by a factor of ~1% (for 70% Si, 30% Ge) and so strain-inducing silicon/germanium source/drain regions 220 are comprised of a material with a larger lattice constant than that of the channel region 206. Therefore, a uniaxial compressive strain, depicted by the arrows in FIG. 2C, is rendered on channel region 206 in PMOS-FET 230, which can enhance hole mobility in the device.

In order to improve performance in N-type Metal Oxide Semiconductor Field-Effect Transistors (NMOS-FETs), a uniaxial tensile strain may be required to enhance electron mobility in the channel region. This may require the incorporation of strain-inducing source/drain regions with a smaller lattice constant than that of the channel region. For example, epitaxial carbon-doped silicon source/drain regions may be desirable for NMOS-FETs with a crystalline silicon channel region because the lattice constant of epitaxial carbon-doped silicon is smaller than that of crystalline silicon. However, selective deposition of an epitaxial carbon-doped silicon film can be difficult. Furthermore, subsequent incorporation of N-type dopants, e.g. phosphorus, into such an epitaxial carbon-doped silicon film may modify the film by displacing the lattice-incorporated carbon atoms. Such displacement of lattice-incorporated carbon atoms may reduce the lattice constant differential between the resulting source/drain regions and the channel region, effectively mitigating any performance-enhancing strain induced on the channel region.

Thus, a method to fabricate semiconductor devices comprising strain-inducing semiconductor regions is described herein.

DETAILED DESCRIPTION

Figure 1:
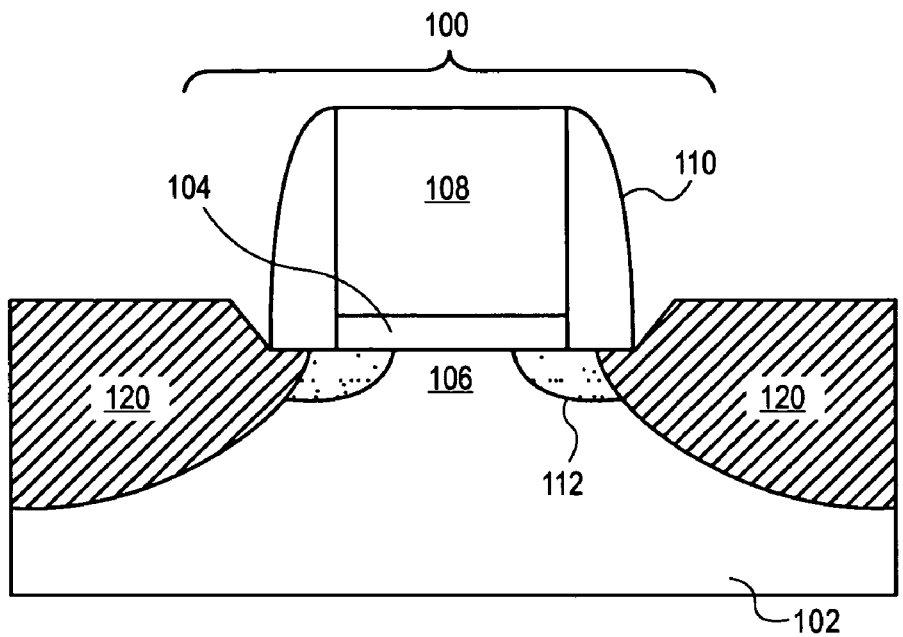
FIG. 1 illustrates a cross-sectional view of a strained P-type Metal Oxide Semiconductor Field-Effect Transistor (PMOS-FET), in accordance with the prior art.
Figure 2A:
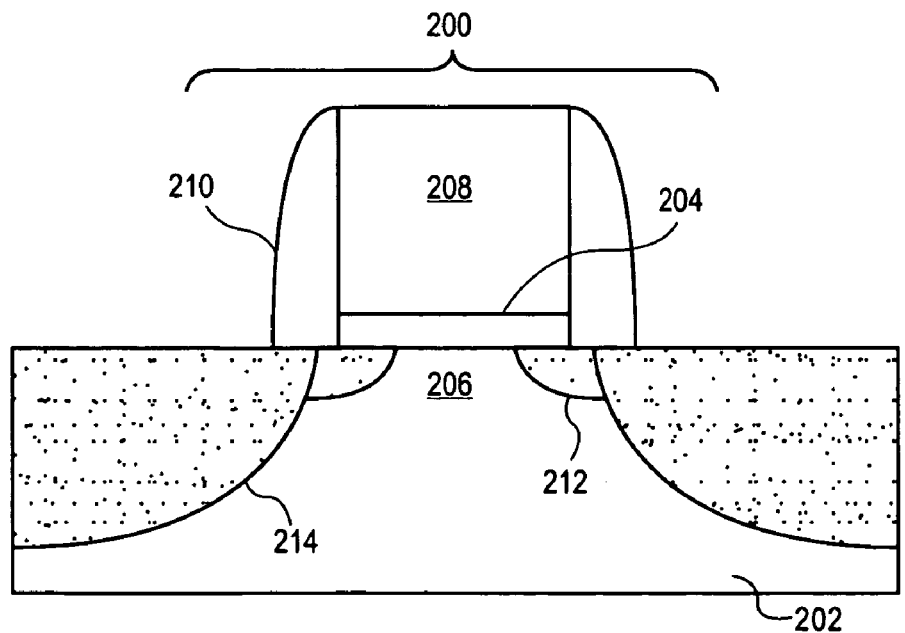
FIGS. 2A-C illustrate cross-sectional views representing the formation of a PMOS-FET device with strain-inducing silicon/germanium source/drain regions, in accordance with the prior art.
Figure 2B:
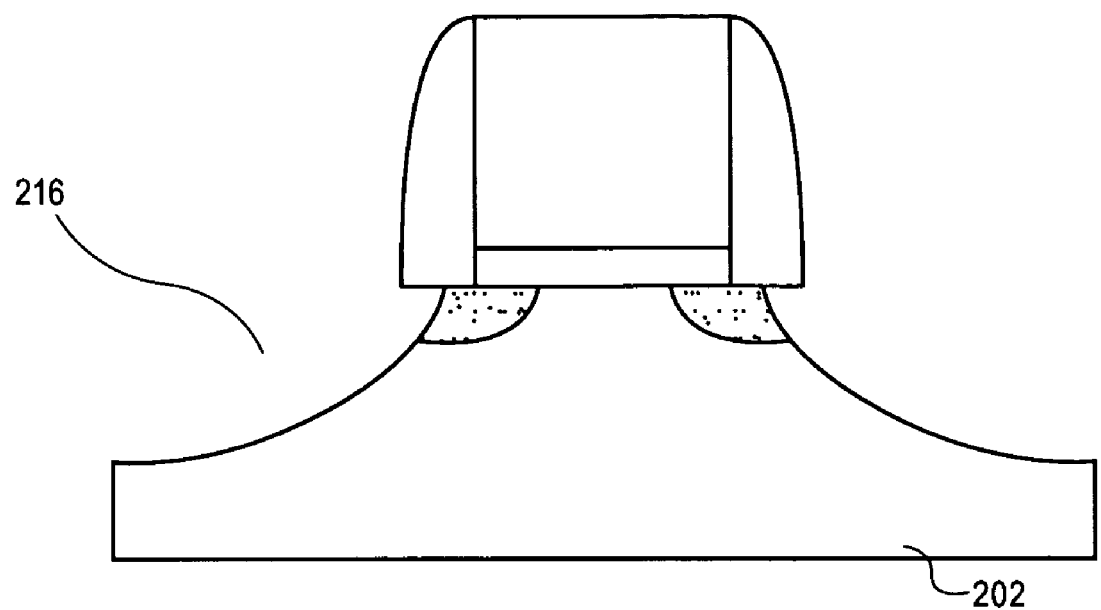
Figure 2C:
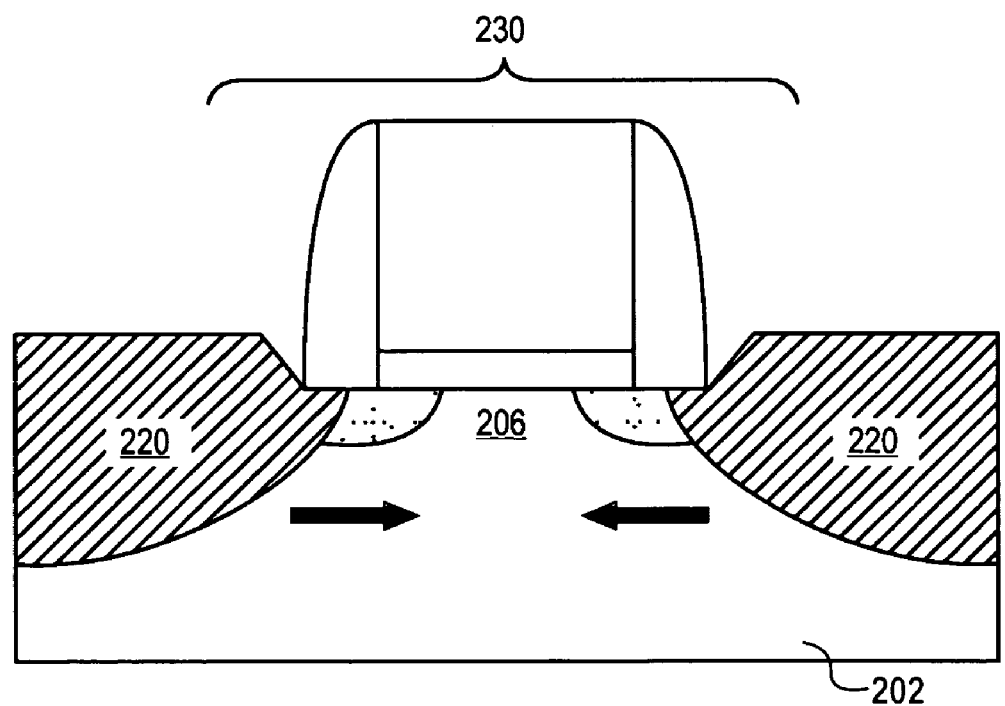

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a method to form a strain-inducing semiconductor region comprising three or more species of charge-neutral lattice-forming atoms. Formation of a strain-inducing semiconductor region comprising three or more species of charge-neutral lattice-forming atoms laterally adjacent to a crystalline substrate may result in a uniaxial strain induced on the crystalline substrate, providing a strained crystalline substrate. For example, a MOS-FET may comprise a crystalline substrate and laterally adjacent strain-inducing source/drain regions, wherein the strain-inducing source/drain regions comprise three or more species of charge-neutral lattice-forming atoms. The laterally adjacent strain-inducing source/drain regions may impart a uniaxial strain to the crystalline substrate, forming a strained crystalline substrate in the MOS-FET. In the case where the crystalline substrate comprises a channel region, a strained channel region may thus be provided. A MOS-FET that comprises a strained channel region may exhibit an enhanced carrier mobility in the channel region when in an ON state.

A semiconductor region formed on or in a crystalline substrate may impart a strain to the crystalline substrate, and hence may be a strain-inducing semiconductor region, if the lattice constant of the semiconductor region is different from the lattice constant of the crystalline substrate. The lattice constants are based on the atomic spacings and the unit cell orientations within each of the semiconductor region and the crystalline substrate. Thus, a semiconductor region comprising different species of lattice-forming atoms than the crystalline substrate may impart a strain to the crystalline substrate. For example, in accordance with an embodiment of the present invention, a semiconductor region that comprises silicon, germanium and carbon lattice-forming atoms may impart a strain to a crystalline substrate comprised of only germanium lattice-forming atoms. Furthermore, a semiconductor region comprising the same species of lattice-forming atoms as the crystalline substrate, but wherein the species of lattice-forming atoms are present in different stoichiometric concentrations, may impart a strain to the crystalline substrate. For example, in accordance with an embodiment of the present invention, a semiconductor region that comprises $In_xGa_{1-x}As$ lattice-forming atoms (where $0<x<1$) may impart a strain to a crystalline substrate comprised of $In_yGa_{1-y}As$ lattice-forming atoms (where $0<y<1$, and $x \neq y$). Thus, combining the above examples, a semiconductor region with a crystalline lattice of three or more species of lattice-forming atoms may impart a strain to a crystalline substrate with a crystalline lattice of one or more species of lattice-forming atoms, wherein the lattice constant of the semiconductor region is different from that of the crystalline substrate.

A strain-inducing semiconductor region formed in an etched-out portion of a crystalline substrate may impart a uniaxial strain to the crystalline substrate. In turn, the crystalline substrate may impart a uniaxial strain to the strain-inducing semiconductor region. For example, in accordance with an embodiment of the present invention, a MOS-FET device comprises strain-inducing source/drain regions formed in etched-out portions of a crystalline substrate. The strain-inducing source/drain regions may impart a uniaxial strain to the crystalline substrate, while the crystalline substrate imparts a uniaxial strain to the strain-inducing source/drain regions. In one embodiment, the lattice constant of the strain-inducing source/drain regions is smaller than the lattice constant of the crystalline substrate and the strain-inducing source/drain regions impart a tensile uniaxial strain to the crystalline substrate, while the crystalline substrate imparts a tensile strain to the strain-inducing source/drain regions. Thus, when the lattice constant of a strain-inducing source/drain region that fills an etched-out portion of a crystalline substrate is smaller than the lattice constant of the crystalline substrate, the lattice-forming atoms of the strain-inducing source/drain region are pulled apart (i.e. tensile strain) from their normal resting state and hence may induce a tensile strain on the crystalline substrate as they attempt to relax. In another embodiment, the lattice constant of the strain-inducing source/drain regions is larger than the lattice constant of the crystalline substrate and the strain-inducing source/drain regions impart a compressive uniaxial strain to the crystalline substrate, while the crystalline substrate imparts a compressive strain to the strain-inducing source/drain regions. Thus, when the lattice constant of a strain-inducing source/drain region that fills an etched-out portion of a crystalline substrate is larger than the lattice constant of the crystalline substrate, the lattice-forming atoms of the strain-inducing source/drain region are pushed together (i.e. compressive strain) from their normal resting state and hence may induce a compressive strain on the crystalline substrate as they attempt to relax. Therefore, either a compressive or tensile uniaxial strain may be imparted to a crystalline substrate by a strain-inducing semiconductor region.

Charge-carrier dopant impurity atoms (e.g. As dopant impurity atoms in a Si semiconductor region or Te dopant impurity atoms in a III-V semiconductor region) may have an effect on the lattice constant of the semiconductor region in which they are implanted. However, at typical concentrations of dopant impurity atoms, e.g. 1E15-5E21 atoms/cm$^3$, the modification of the lattice constant may be very small with respect to the amount of strain imparted by a strain-inducing semiconductor region to a crystalline substrate. The use of charge-neutral lattice-forming atoms (e.g. Ge and C in a Si film or Al in a GaAs film) in a strain-inducing semiconductor region may enable a greater variation of the lattice constant of a strain-inducing semiconductor region, and hence a greater amount of imparted strain to the crystalline substrate, without significantly impacting the electrical properties of the strain-inducing semiconductor region. For example, in accordance with an embodiment of the present invention, three or more species of charge-neutral lattice-forming atoms are used to provide a strain-inducing semiconductor region with a lattice constant different from the lattice constant of a crystalline substrate by a factor of at least 0.1%. In another embodiment, three or more species of charge-neutral lattice-forming atoms are used to provide a strain-inducing semiconductor region with a lattice constant different from the lattice constant of a crystalline substrate by a factor in the range of 0.5%-1.5%. Thus, a significant amount of the lattice-constant variation in a strain-inducing semiconductor region may be provided with the use of three or more species of charge-neutral lattice-forming atoms. Furthermore, by using a strain-inducing semiconductor region comprising three or more species of charge-neutral lattice-forming atoms may enable an increased solubility, and hence decreased diffusivity, of charge-carrier dopant impurity atoms in the strain-inducing semiconductor region. Thus, in accordance with an embodiment of the present invention, a strain-inducing semiconductor region with a reduced resistivity is formed.

Figure 3A:
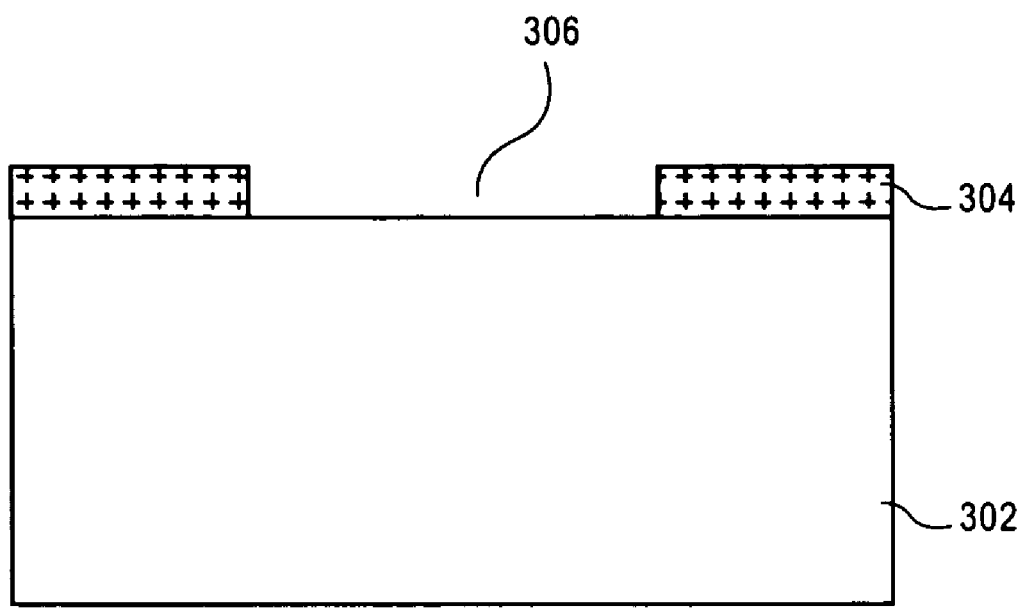
FIGS. 3A-D illustrate cross-sectional views representing the formation of a strain-inducing semiconductor region in an etched-out region of a crystalline substrate, in accordance with an embodiment of the present invention.

As an example of one embodiment of the present invention, FIGS. 3A-D illustrate cross-sectional views representing the formation of a strain-inducing semiconductor region comprising three or more species of charge-neutral lattice-forming atoms in an etched-out region of a crystalline substrate. Referring to FIG. 3A, a crystalline substrate 302 may be masked by masking layer 304 with an opening 306. In one embodiment of the present invention, crystalline substrate 302 is comprised of silicon, germanium or silicon/germanium of the stoichiometry $Si_xGe_{1-x}$, where 0<x<1. In another embodiment, crystalline substrate 302 is comprised of a III-V material selected from the group consisting of $Al_xGa_{1-x}As$, $In_xGa_{1-x}As$, $In_xGa_{1-x}P$ or $Al_xIn_{1-x}Sb$, where $0 \leq x \leq 1$.

Figure 3B:
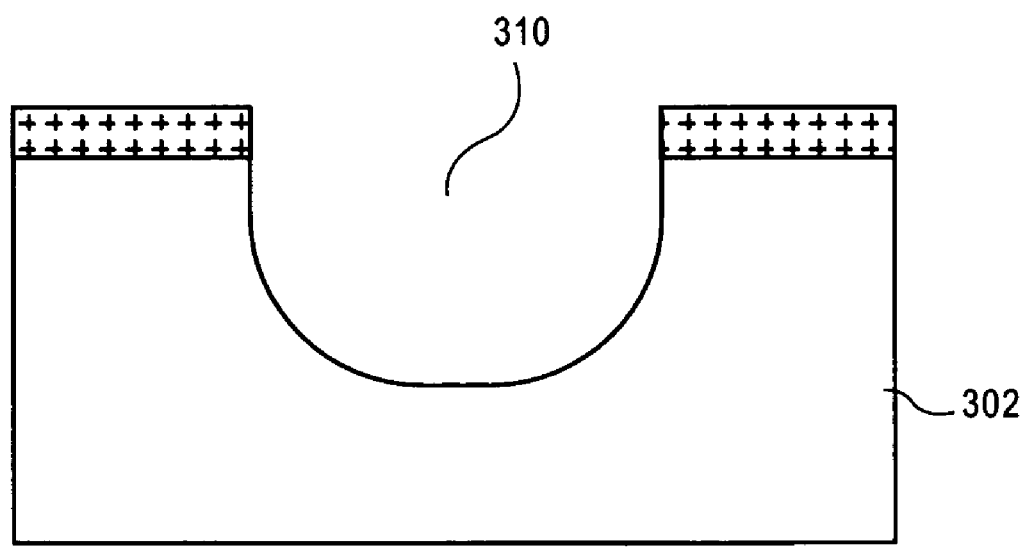
Figure 3C:
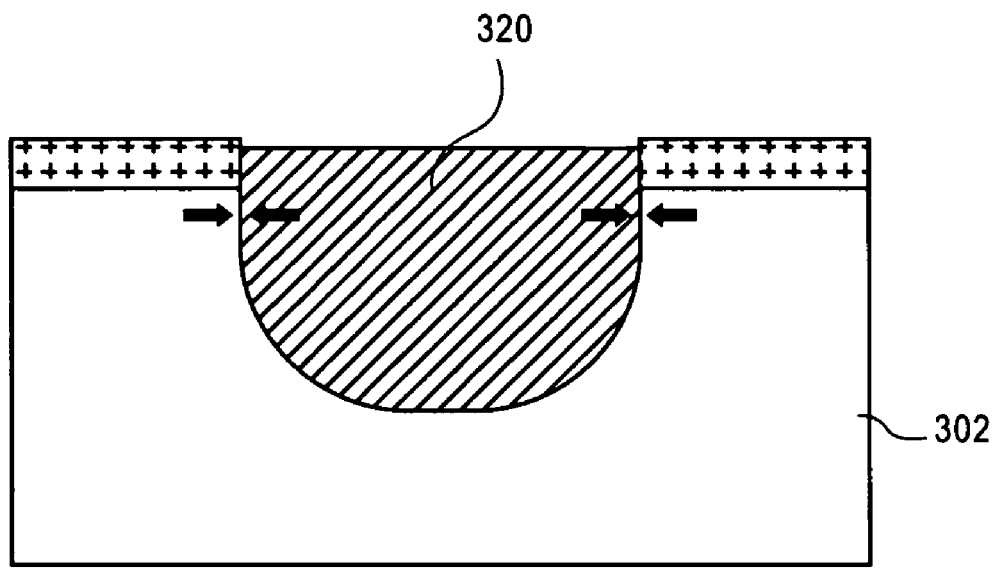
Figure 3D:
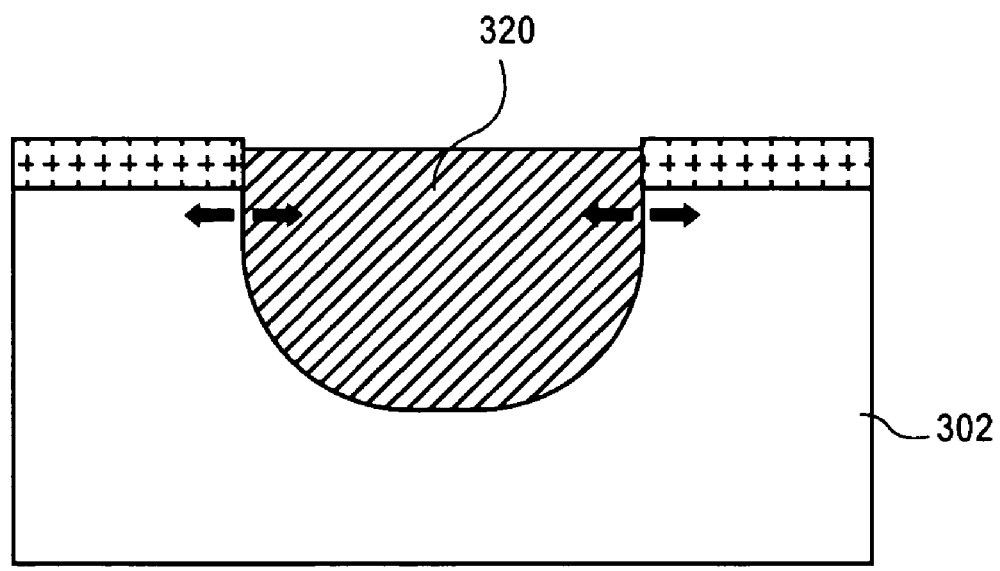

Referring to FIG. 3B, a region of crystalline substrate 302 may be removed to form etched-out region 310. A material region 320 may then be formed in etched-out region 310 of crystalline substrate 302, as depicted in FIG. 3C. In accordance with an embodiment of the present invention, material region 320 is a strain-inducing semiconductor region comprising three or more species of charge-neutral lattice-forming atoms that imparts a compressive uniaxial strain to crystalline substrate 302, as represented by the arrows in FIG. 3C. In another embodiment, material region 320 is a strain-inducing semiconductor region comprising three or more species of charge-neutral lattice-forming atoms that imparts a tensile uniaxial strain to crystalline substrate 302, as represented by the arrows in FIG. 3D. In one embodiment, crystalline substrate 302 is comprised of silicon, germanium or $Si_xGe_{1-x}$ where 0<x<1 and material region 320 is comprised of $C_ySi_zGe_{1-y-z}$ where y, z≠0. In another embodiment, crystalline substrate 302 is comprised of $Al_xGa_{1-x}As$, $In_xGa_{1-x}As$, $In_xGa_{1-x}P$ or $Al_xIn_{1-x}Sb$ where $0 \leq x \leq 1$ and material region 320 is comprised of $Al_yGa_{1-y}As$, $In_yGa_{1-y}As$, $In_yGa_{1-y}P$ or $Al_yIn_{1-y}Sb$, where 0<y<1. In one embodiment of the present invention, the top surface of material region 320 is raised above the top surface of crystalline substrate 302, as depicted in FIGS. 3C and 3D.

A strain-inducing semiconductor region comprising three or more species of charge-neutral lattice-forming atoms may be utilized in the fabrication of a semiconductor device. In one embodiment, the semiconductor device is a MOS-FET, a bipolar transistor, a memory transistor, a micro-electronic machine (MEM) or a diode. In another embodiment, the semiconductor device is a planar device. In one embodiment, the semiconductor device is a non-planar device, such as a tri-gate, double-gate or gate-all-around transistor. In another embodiment, the semiconductor device comprises a nanowire. For illustrative purposes, the fabrication of a MOS-FET device incorporating a strain-inducing semiconductor region comprising three or more species of charge-neutral lattice-forming atoms is described below.

Figure 4A:
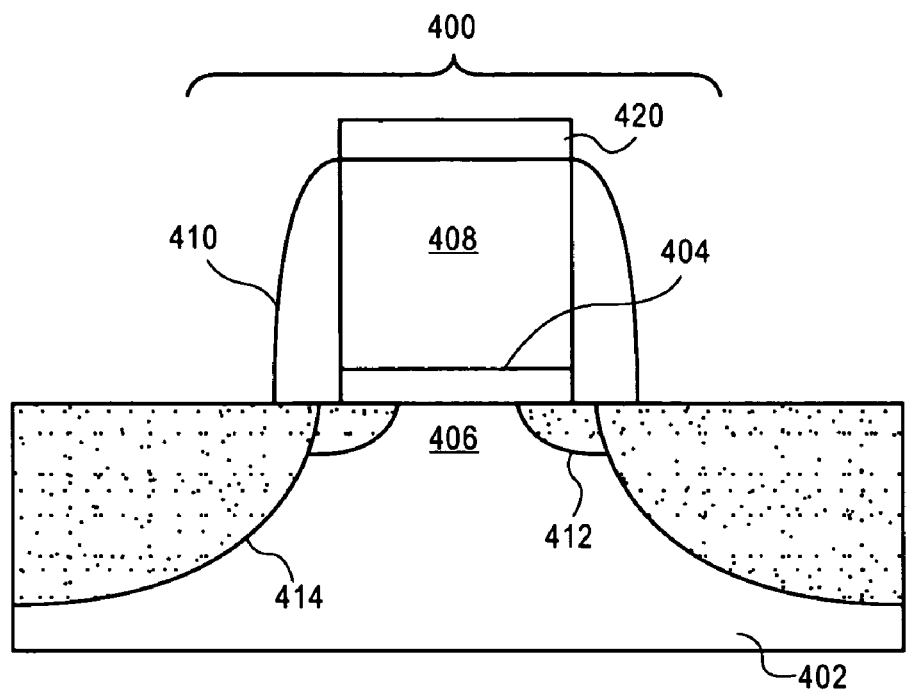
FIGS. 4A-D illustrate cross-sectional views representing the formation of strain-inducing source/drain regions in a MOS-FET device, in accordance with an embodiment of the present invention.

FIGS. 4A-D illustrate cross-sectional views representing the formation of strain-inducing source/drain regions in a MOS-FET device, in accordance with an embodiment of the present invention. Referring to FIG. 4A, a non-strained MOS-FET 400 is first formed. Non-strained MOS-FET 400 may be comprised of a channel region 406 in a crystalline substrate 402. In one embodiment, crystalline substrate 402 is comprised of silicon, germanium or silicon/germanium of the stoichiometry $Si_xGe_{1-x}$, where 0<x<1. In another embodiment, crystalline substrate 402 is comprised of a III-V material selected from the group consisting of $Al_xGa_{1-x}As$, $In_xGa_{1-x}As$, $In_xGa_{1-x}P$ or $Al_xIn_{1-x}Sb$, where $0 \leq x \leq 1$. In one embodiment, crystalline substrate 402 is comprised of an epitaxial layer grown atop a distinct crystalline substrate. In another embodiment, crystalline substrate 402 comprises an insulating layer. In one embodiment, the insulating layer is comprised of silicon dioxide, silicon nitride, silicon oxy-nitride or a high-K dielectric layer. In an embodiment, crystalline substrate 402 is comprised of an epitaxial layer and a bulk crystal substrate with an insulating layer between the bulk crystal substrate and the epitaxial layer forming, for example, a silicon-on-insulator substrate.

A gate dielectric layer 404 may be formed above channel region 406. In one embodiment, gate dielectric layer 404 is formed by a thermal oxidation process and is comprised of silicon dioxide or silicon oxy-nitride. In another embodiment, gate dielectric layer 404 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

A gate electrode 408 may be formed above gate dielectric layer 404. Gate electrode 408 may be formed by a subtractive etching process scheme or by a replacement gate process scheme. In one embodiment, gate electrode 408 is comprised of a polycrystalline silicon gate electrode, wherein the charge-carrier dopant impurities are implanted during fabrication of the tip and source/drain regions, described below. In another embodiment, gate electrode 408 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. In one embodiment, a protective layer 420 is retained above gate electrode 408, as depicted in FIG. 4A.

A tip extension 412 may be formed by implanting charge-carrier dopant impurity atoms into crystalline substrate 402. Gate electrode 408 may act to mask a portion of crystalline substrate 402 to form self-aligned tip extensions 412. In one embodiment, crystalline substrate 402 is comprised of silicon, germanium or silicon/germanium of the stoichiometry $Si_xGe_{1-x}$ where 0<x<1, and the charge-carrier dopant impurity atoms used to form tip extension 412 are selected from the group consisting of boron, arsenic, indium or phosphorus. In another embodiment, crystalline substrate 402 is comprised of $Al_xGa_{1-x}As$, $In_xGa_{1-x}As$, $In_xGa_{1-x}P$ or $Al_xIn_{1-x}Sb$, where $0 \leq x \leq 1$, and the charge-carrier dopant impurity atoms used to form tip extension 412 are selected from the group consisting of carbon, silicon, germanium, oxygen, sulfur, selenium or tellurium.

Gate dielectric layer 404 and gate electrode 408 may be isolated by gate isolation spacer 410. Gate isolation spacer 410 may be formed by any suitable technique that provides a dielectric barrier adjacent the sidewall of gate electrode 408. In an embodiment, an insulating layer such as but not limited to silicon dioxide, silicon nitride, silicon oxy-nitride or carbon-doped silicon nitride is deposited by a chemical vapor deposition process and is subsequently dry etched. In another embodiment, the thickness of the insulating layer is selected to determine the final width of gate isolation spacer 410. In one embodiment, gate isolation spacer 410 forms a hermetic seal with gate electrode 408 and the top surface of crystalline substrate 402 in order to encapsulate gate dielectric layer 404, as depicted in FIG. 4A.

A source/drain region 414 may be formed by implanting charge-carrier dopant impurity atoms into crystalline substrate 402. Gate isolation spacer 410 and gate electrode 408 may act to shield a portion of substrate 402 during the implant step to form self-aligned source/drain regions 414, as depicted in FIG. 4A. In effect, the thickness of gate isolation spacer 410 may play a role in dictating the dimensions of source/drain region 414. Source/drain region 414 may be formed using the same initial material as channel region 406. Therefore, the lattice mismatch between source/drain region 414 and channel region 406 may be negligible, resulting in minimal effective strain imparted to channel region 406 of non-strained MOS-FET 400. In one embodiment, crystalline substrate 402 is comprised of silicon, germanium or silicon/germanium of the stoichiometry $Si_xGe_{1-x}$ where 0<x<1, and the charge-carrier dopant impurity atoms used to form source/drain region 414 are selected from the group consisting of boron, arsenic, indium or phosphorus. In another embodiment, crystalline substrate 402 is comprised of $Al_xGa_{1-x}As$, $In_xGa_{1-x}As$, $In_xGa_{1-x}P$ or $Al_xIn_{1-x}Sb$ where 0≦x≦1, and the charge-carrier dopant impurity atoms used to form source/drain region 414 are selected from the group consisting of carbon, silicon, germanium, oxygen, sulfur, selenium or tellurium.

Figure 4B:
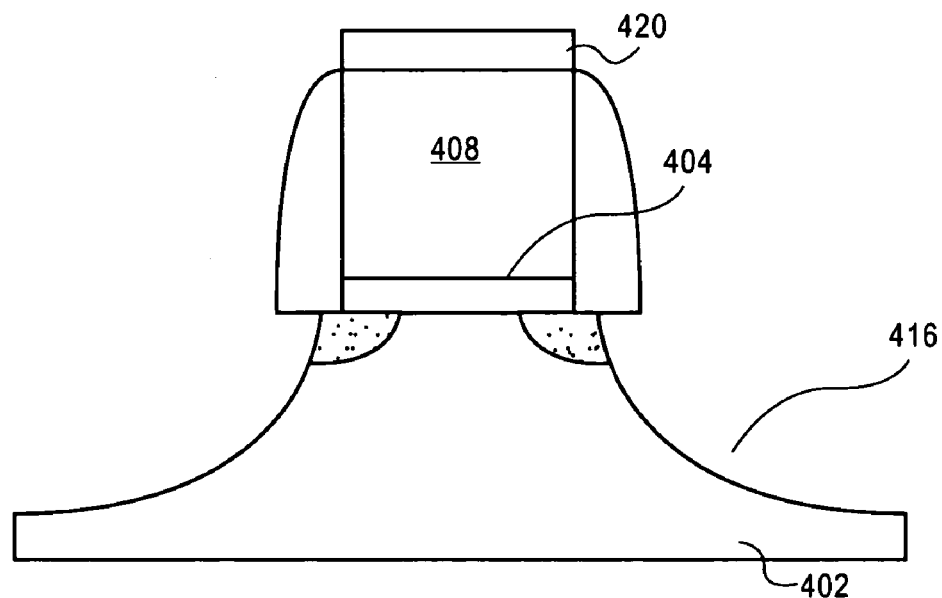

Referring to FIG. 4B, portions of crystalline substrate 402, including source/drain region 414, may be removed to form etched-out region 416 in substrate 402. Etched-out region 416 may be formed by any suitable technique that selectively removes a portion of crystalline substrate 402 without significantly impacting gate dielectric layer 404, gate electrode 408 or tip extension 412, such as a dry etch or a wet etch process. In one embodiment, etched-out region 416 is formed by a dry plasma etch using $NF_3$, HBr, $SF_6/Cl$ or $Cl_2$ or a wet etch using $NH_4OH$ or tetramethylammonium hydroxide. In one embodiment, protective layer 420 protects gate electrode 408 during the formation of etched-out region 416. In another embodiment, etched-out region 416 is formed to a depth sufficient to remove the charge-carrier dopant impurities implanted to form source/drain region 414, as depicted in FIG. 4B.

Figure 4C:
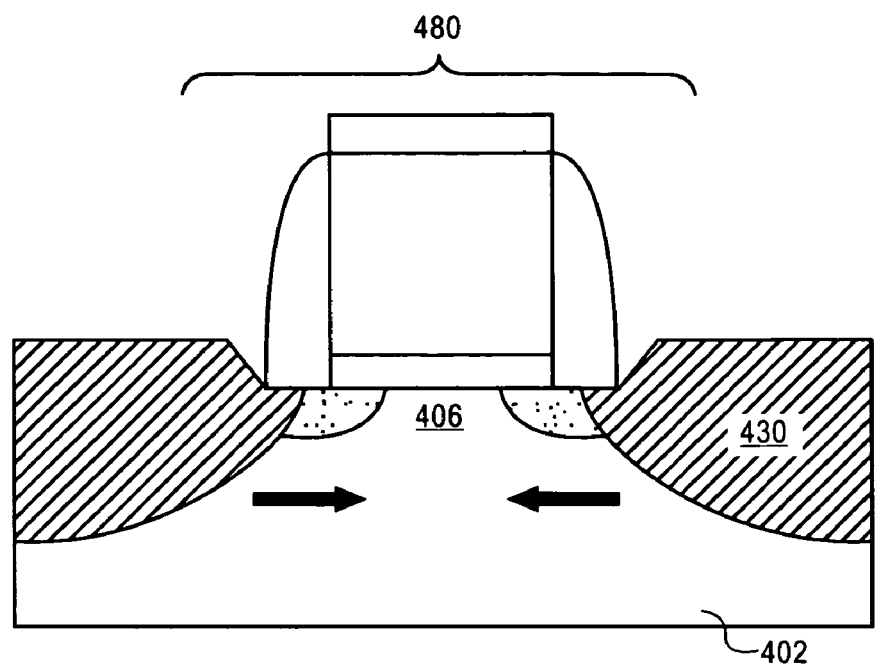
Figure 4D:
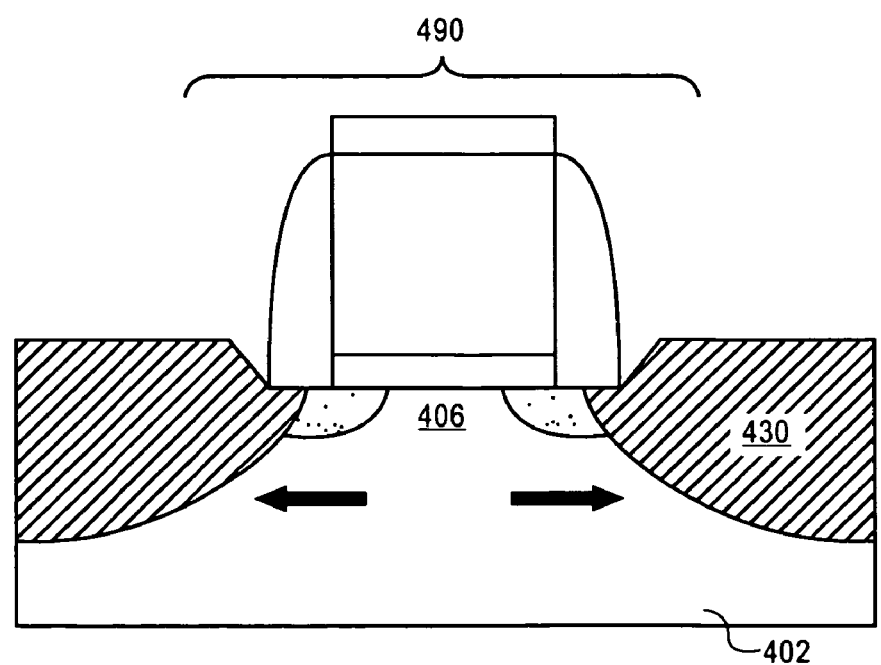

Referring to FIG. 4C, epitaxial source/drain region 430 may be formed selectively in etched-out region 416. In accordance with an embodiment of the present invention, epitaxial source/drain region 430 is a strain-inducing semiconductor region comprising three or more species of charge-neutral lattice-forming atoms that imparts a compressive uniaxial strain to crystalline substrate 402, as represented by the arrows in FIG. 4C. In another embodiment, epitaxial source/drain region 430 is a strain-inducing semiconductor region comprising three or more species of charge-neutral lattice-forming atoms that imparts a tensile uniaxial strain to crystalline substrate 402, as represented by the arrows in FIG. 4D. In one embodiment, crystalline substrate 402 is comprised of silicon, germanium or $Si_xGe_{1-x}$ where 0<x<1 and epitaxial source/drain region 430 is comprised of $C_ySi_zGe_{1-y-z}$ where y, z≠0. In one embodiment, crystalline substrate 402 is comprised of $Al_xGa_{1-x}As$, $In_xGa_{1-x}As$, $In_xGa_{1-x}P$ or $Al_xIn_{1-x}Sb$ where 0≦x≦1 and epitaxial source/drain region 430 is comprised of $Al_yGa_{1-y}As$, $In_yGa_{1-y}As$, $In_yGa_{1-y}P$ or $Al_yIn_{1-y}Sb$, where 0<y<1. In one embodiment, the top surface of epitaxial source/drain region 430 is raised above the top surface of crystalline substrate 402, as depicted in FIGS. 4C and 4D.

In accordance with an embodiment of the present invention, charge-carrier dopant impurity atoms are implanted into epitaxial source/drain region 430 either during (i.e. in situ) or subsequent to formation of epitaxial source/drain region 430. In one embodiment, epitaxial source/drain region 430 is comprised of $C_ySi_zGe_{1-y-z}$, where y, z≠0, and the charge-carrier dopant impurity atoms implanted are selected from the group consisting of boron, arsenic, indium or phosphorus. In another embodiment, epitaxial source/drain region 430 is comprised of $Al_yGa_{1-y}As$, $In_yGa_{1-y}As$, $In_yGa_{1-y}P$ or $Al_yIn_{1-y}Sb$, where 0<y<1, and the charge-carrier dopant impurity atoms implanted are selected from the group consisting of carbon, silicon, germanium, oxygen, sulfur, selenium or tellurium.

Thus, a method to form a MOS-FET device comprising a strained crystalline substrate 402, and hence a strained channel region 406, and strain-inducing source/drain regions 430, comprising three or more species of charge-neutral lattice-forming atoms, has been described. In accordance with an embodiment of the present invention, strain-inducing source/drain region 430 imparts a uniaxial strain to strained crystalline substrate 402 and, in turn, strained crystalline substrate 402 imparts a uniaxial strain to strain-inducing source/drain region 430. In one embodiment, strain-inducing source/drain region 430 comprises three or more species of charge-neutral forming atoms and has a lattice constant different from the lattice constant of strained crystalline substrate 402. In accordance with an embodiment of the present invention, the MOSFET device formed above is a PMOS-FET device 480 having a compressive-strained crystalline substrate 402, and hence a compressive-strained channel region 406, as depicted by the arrows in FIG. 4C. Thus, a PMOS-FET with enhanced hole mobility may be formed. In accordance with another embodiment of the present invention, the MOSFET device formed above is an NMOS-FET device 490 having a tensile-strained crystalline substrate 402, and hence a tensile-strained channel region 406, as depicted by the arrows in FIG. 4D. Thus, an NMOS-FET with enhanced electron mobility may be formed. PMOS-FET 480 or NMOS-FET 490 may subsequently be incorporated into an integrated circuit by conventional process steps, as known in the art.

Figure 5A:
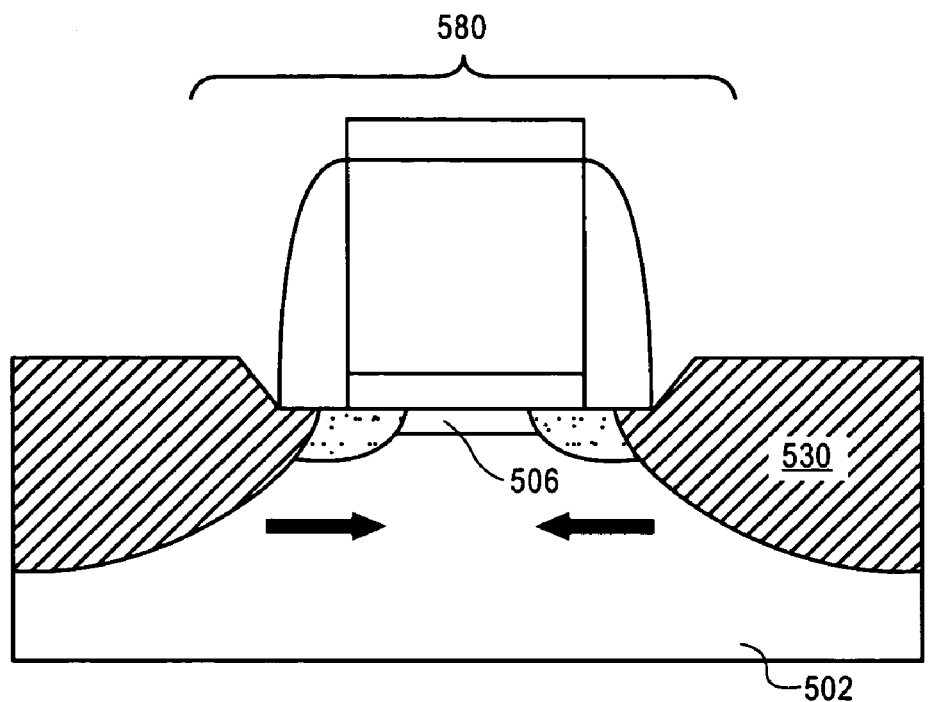
FIGS. 5A-B illustrate cross-sectional views representing MOS-FET devices comprising strain-inducing source/drain regions and a strained channel layer, in accordance with an embodiment of the present invention.
Figure 5B:
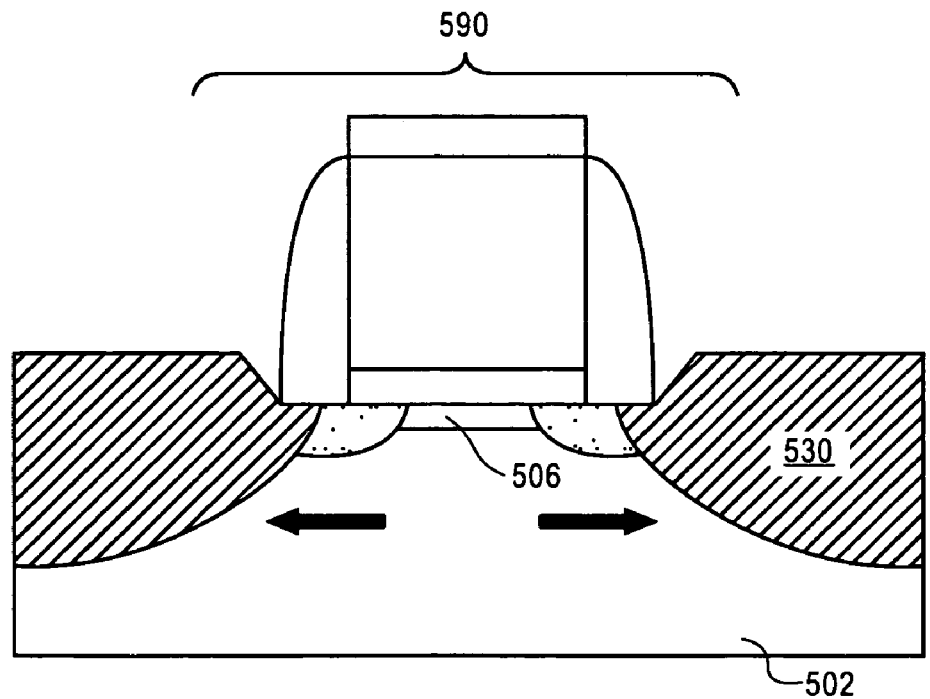

The present invention is not limited to the formation of semiconductor devices with channel regions contained in the crystalline substrate. In accordance with an embodiment of the present invention, a uniaxial strain is imparted to an epitaxial layer directly above a strained crystalline substrate, wherein the epitaxial layer comprises a channel region. Thus, a strain-inducing semiconductor region comprising three or more species of charge-neutral lattice-forming atoms may be used to impart strain to a channel region in a layer distinct from the strained crystalline substrate. FIGS. 5A-B illustrate cross-sectional views representing MOS-FET devices comprising strain-inducing source/drain regions comprising three or more species of charge-neutral lattice-forming atoms and a strained channel layer, in accordance with another embodiment of the present invention.

Referring to FIGS. 5A and 5B, a MOSFET may comprise a channel layer 506. Channel layer 506 may be comprised of any material suitable to allow charge carriers to migrate from a source region to a drain region when a MOS-FET or related device is in an ON state. In one embodiment, channel layer 506 comprises an epitaxial layer of silicon, germanium or silicon/germanium. In another embodiment, channel layer 506 comprises AlAs, GaAs, InAs, InP, GaP, AlSb, InSb, $Al_xGa_{1-x}As$, $In_xGa_{1-x}As$, $In_xGa_{1-x}P$ or $Al_xIn_{1-x}Sb$, where 0<x<1.

Epitaxial source/drain region 530 may be formed selectively in an etched-out region of crystalline substrate 502. In accordance with an embodiment of the present invention, epitaxial source/drain region 530 is a strain-inducing semiconductor region comprising three or more species of charge-neutral lattice-forming atoms that imparts a compressive uniaxial strain to crystalline substrate 502, and hence to channel layer 506, as represented by the arrows in FIG. 5A. In another embodiment, epitaxial source/drain region 530 is a strain-inducing semiconductor region comprising three or more species of charge-neutral lattice-forming atoms that imparts a tensile uniaxial strain on crystalline substrate 502, and hence to channel layer 506, as represented by the arrows in FIG. 5B. In one embodiment, the top surface of epitaxial source/drain region 530 is raised above the top surface of crystalline substrate 502, as depicted in FIGS. 5A and 5B.

In accordance with an embodiment of the present invention, the MOSFET device formed above is a PMOS-FET device 580 having a compressive-strained crystalline substrate 502, and hence a compressive-strained channel layer 506, as depicted in FIG. 5A. Thus, a PMOS-FET comprising a channel layer with enhanced hole mobility may be formed. In accordance with another embodiment of the present invention, the MOSFET device formed above is an NMOS-FET device 590 having a tensile-strained crystalline substrate 502, and hence a tensile-strained channel region 506, as in FIG. 5B. Thus, an NMOS-FET comprising a channel layer with enhanced electron mobility may be formed. PMOS-FET 580 or NMOS-FET 590 may subsequently be incorporated into an integrated circuit by conventional process steps, as known in the art.

Figure 6A:
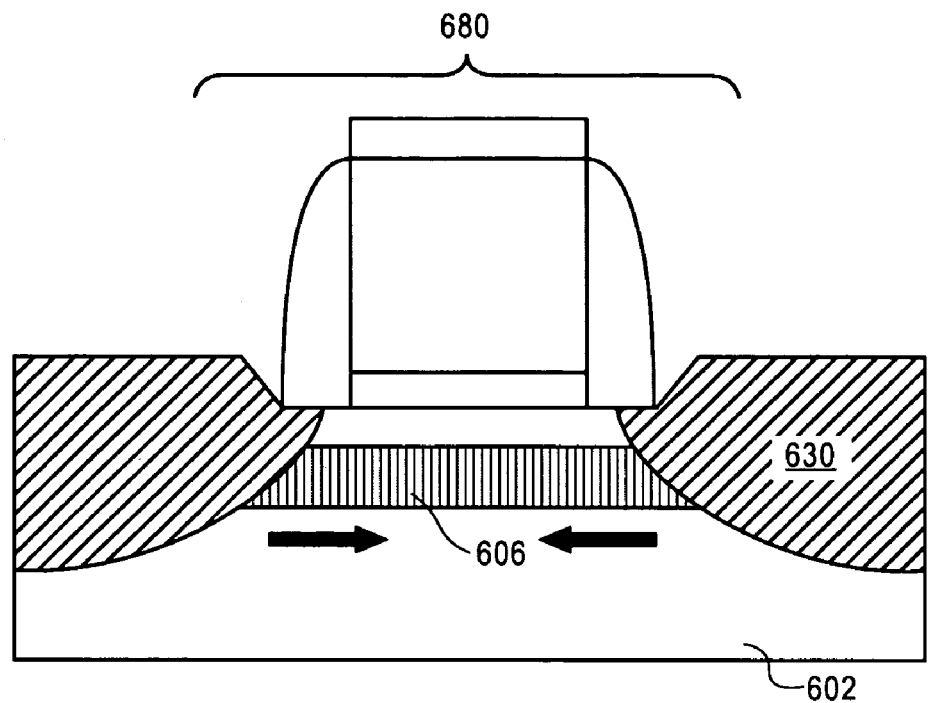
FIGS. 6A-B illustrate cross-sectional views representing MOS-FET devices comprising strain-inducing source/drain regions and a strained quantum well region, in accordance with an embodiment of the present invention.
Figure 6B:
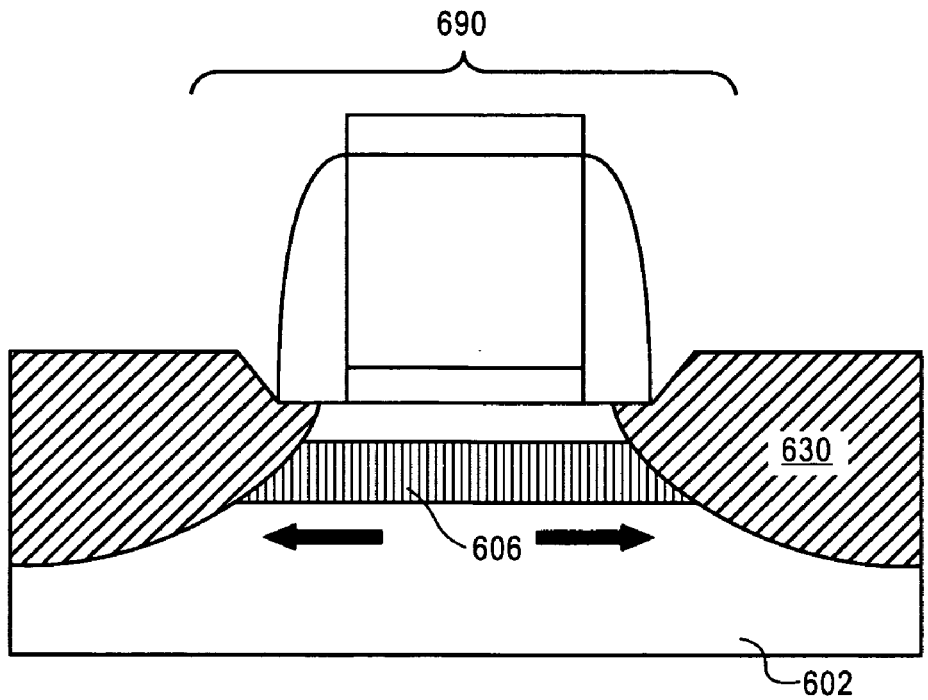

A strain-inducing semiconductor region comprising three or more species of charge-neutral lattice-forming atoms may impart a strain to a region contained within a crystalline substrate. For example, in accordance with another embodiment of the present invention, a uniaxial strain is imparted to a buried channel or quantum well region contained within a strained crystalline substrate, wherein the buried channel or quantum well region acts as a channel region. FIGS. 6A-B illustrate cross-sectional views representing MOS-FET devices comprising strain-inducing source/drain regions comprising three or more species of charge-neutral lattice-forming atoms and a strained buried channel or quantum well region.

Referring to FIGS. 6A and 6B, a MOSFET may comprise a buried channel or quantum well region 606. Buried channel or quantum well region 606 may be comprised of any material suitable to allow charge carriers to migrate from a source region to a drain region when a MOS-FET or related device is in an ON state. In one embodiment, buried channel or quantum well region 606 comprises silicon, germanium or silicon/germanium. In another embodiment, buried channel or quantum well region 606 comprises AlAs, GaAs, InAs, InP, GaP, AlSb, InSb, $Al_xGa_{1-x}As$, $In_xGa_{1-x}As$, $In_xGa_{1-x}P$ or $Al_xIn_{1-x}Sb$, where $0<x<1$.

Epitaxial source/drain region 630 may be formed selectively in an etched-out region of crystalline substrate 602. In accordance with an embodiment of the present invention, epitaxial source/drain region 630 is a strain-inducing semiconductor region comprising three or more species of charge-neutral lattice-forming atoms that imparts a compressive uniaxial strain to crystalline substrate 602, and hence to buried channel or quantum well region 606, as represented by the arrows in FIG. 6A. In another embodiment, epitaxial source/drain region 630 is a strain-inducing semiconductor region comprising three or more species of charge-neutral lattice-forming atoms that imparts a tensile uniaxial strain on crystalline substrate 602, and hence to buried channel or quantum well region 606, as represented by the arrows in FIG. 6B. In one embodiment, the top surface of epitaxial source/drain region 630 is raised above the top surface of crystalline substrate 602, as depicted in FIGS. 6A and 6B.

In accordance with an embodiment of the present invention, the MOSFET device formed above is a PMOS-FET device 680 having a compressive-strained crystalline substrate 602, and hence a compressive-strained buried channel or quantum well region 606, as depicted in FIG. 6A. Thus, a PMOS-FET comprising a buried channel or quantum well region with enhanced hole mobility may be formed. In accordance with another embodiment of the present invention, the MOSFET device formed above is an NMOS-FET device 690 having a tensile-strained crystalline substrate 602, and hence a tensile-strained buried channel or quantum well region 606, as depicted in FIG. 6B. Thus, an NMOS-FET comprising a buried channel or quantum well region with enhanced electron mobility may be formed. PMOS-FET 680 or NMOS-FET 690 may subsequently be incorporated into an integrated circuit by conventional process steps, as known in the art.

The present invention is not limited to the formation of planar semiconductor devices. In accordance with an embodiment of the present invention, a uniaxial strain is imparted to the three-dimensional crystalline structure of a tri-gate MOS-FET device. Thus, a strain-inducing semiconductor region comprising three or more species of charge-neutral lattice-forming atoms may be used to impart strain to a three-dimensional channel structure. FIGS. 7A-D illustrate cross-sectional views representing the formation of strain-inducing source/drain regions comprising three or more species of charge-neutral lattice-forming atoms in a tri-gate MOS-FET device, in accordance with an embodiment of the present invention.

Figure 7A:
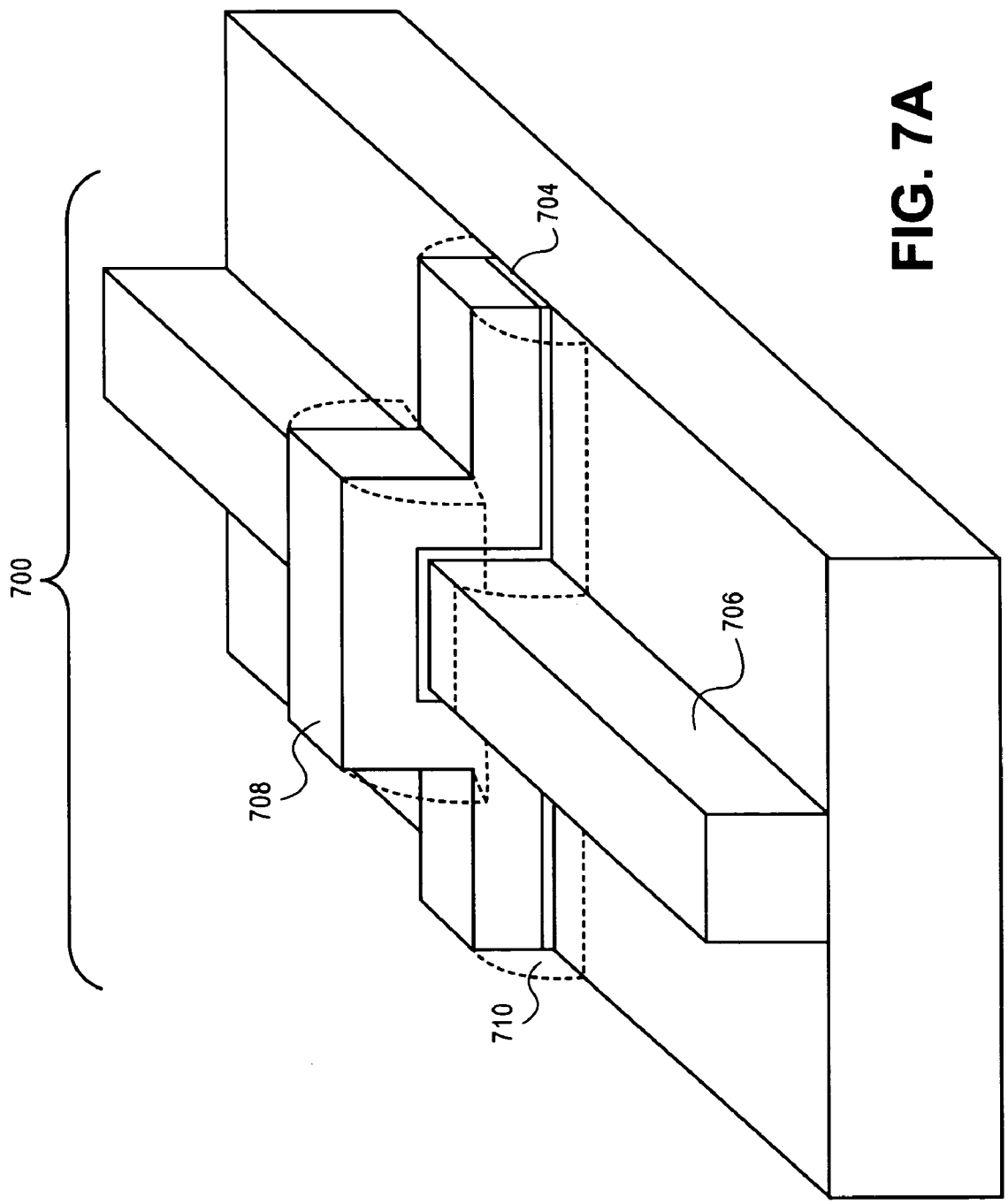
FIGS. 7A-D illustrate cross-sectional views representing the formation of three-dimensional strain-inducing epitaxial regions in a tri-gate MOS-FET device, in accordance with an embodiment of the present invention.

Referring to FIG. 7A, a non-strained tri-gate MOS-FET 700 is first formed. Non-strained tri-gate MOS-FET 700 may be comprised of a three-dimensional crystalline structure 706. In one embodiment of the present invention, three-dimensional crystalline structure 706 is comprised of silicon, germanium or silicon/germanium of the stoichiometry $Si_xGe_{1-x}$, where $0<x<1$. In another embodiment, three-dimensional crystalline structure 706 is comprised of a III-V material selected from the group consisting of $Al_xGa_{1-x}As$, $In_xGa_{1-x}As$, $In_xGa_{1-x}P$ or $Al_xIn_{1-x}Sb$, where $0 \leq x \leq 1$. In one embodiment, three-dimensional crystalline structure 706 is formed above a crystalline substrate. In another embodiment, three-dimensional crystalline structure 706 is formed above an insulating layer.

A gate dielectric layer 704 may be formed around three-dimensional crystalline structure 706, as depicted in FIG. 7A. In one embodiment, gate dielectric layer 704 is formed by a thermal oxidation process and is comprised of silicon dioxide or silicon oxy-nitride. In another embodiment, gate dielectric layer 704 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

A gate electrode 708 may be formed above gate dielectric layer 704, as depicted in FIG. 7A. Gate electrode 708 may be formed by a subtractive etching process scheme or by a replacement gate process scheme. In one embodiment, gate electrode 708 is comprised of a polycrystalline silicon gate electrode. In another embodiment, gate electrode 708 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide. Gate dielectric layer 704 and gate electrode 708 may be isolated by gate isolation spacer 710.

Figure 7B:
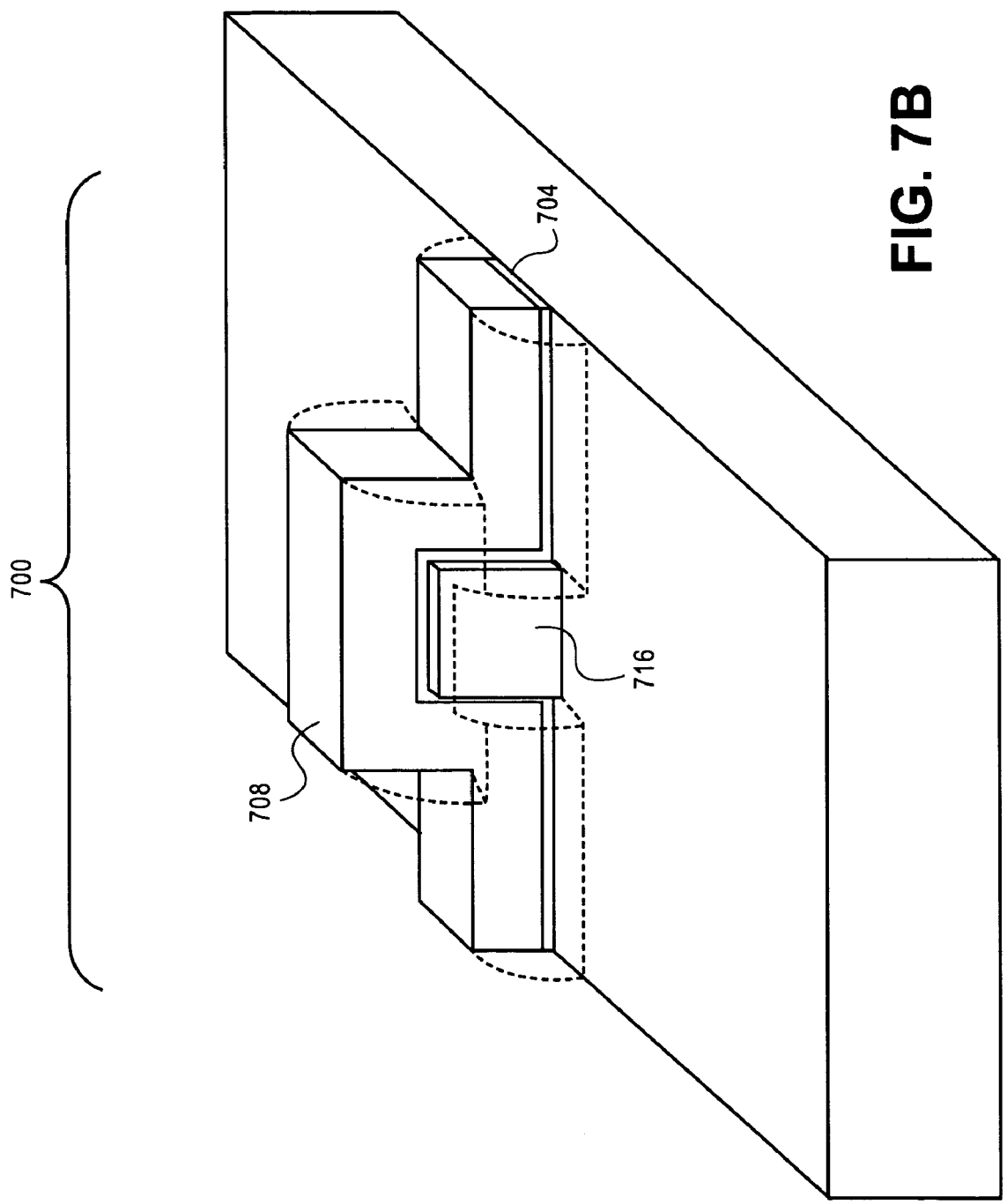

Referring to FIG. 7B, portions of three-dimensional crystalline structure 706 may be removed to form three-dimensional channel structure 716. Three-dimensional channel structure 716 may be formed by any suitable technique that selectively removes a portion of three-dimensional crystalline structure 706 without significantly impacting gate dielectric layer 704 or gate electrode 708, such as a dry etch or a wet etch process. In one embodiment, three-dimensional channel structure 716 is formed by a dry plasma etch using $NF_3$, HBr, $SF_6$/Cl or $Cl_2$ or a wet etch using $NH_4OH$ or tetramethylammonium hydroxide.

Figure 7C:
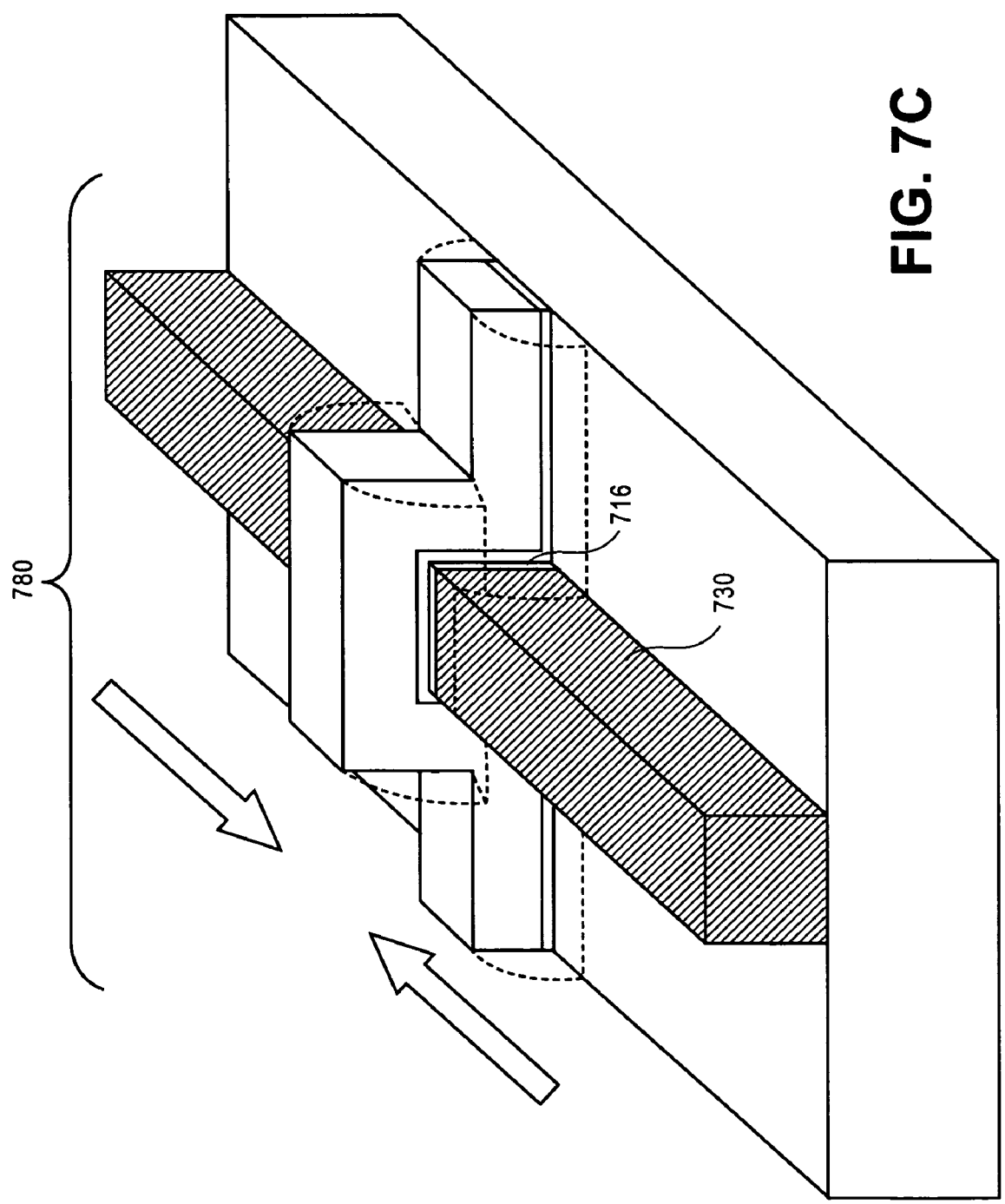
Figure 7D:
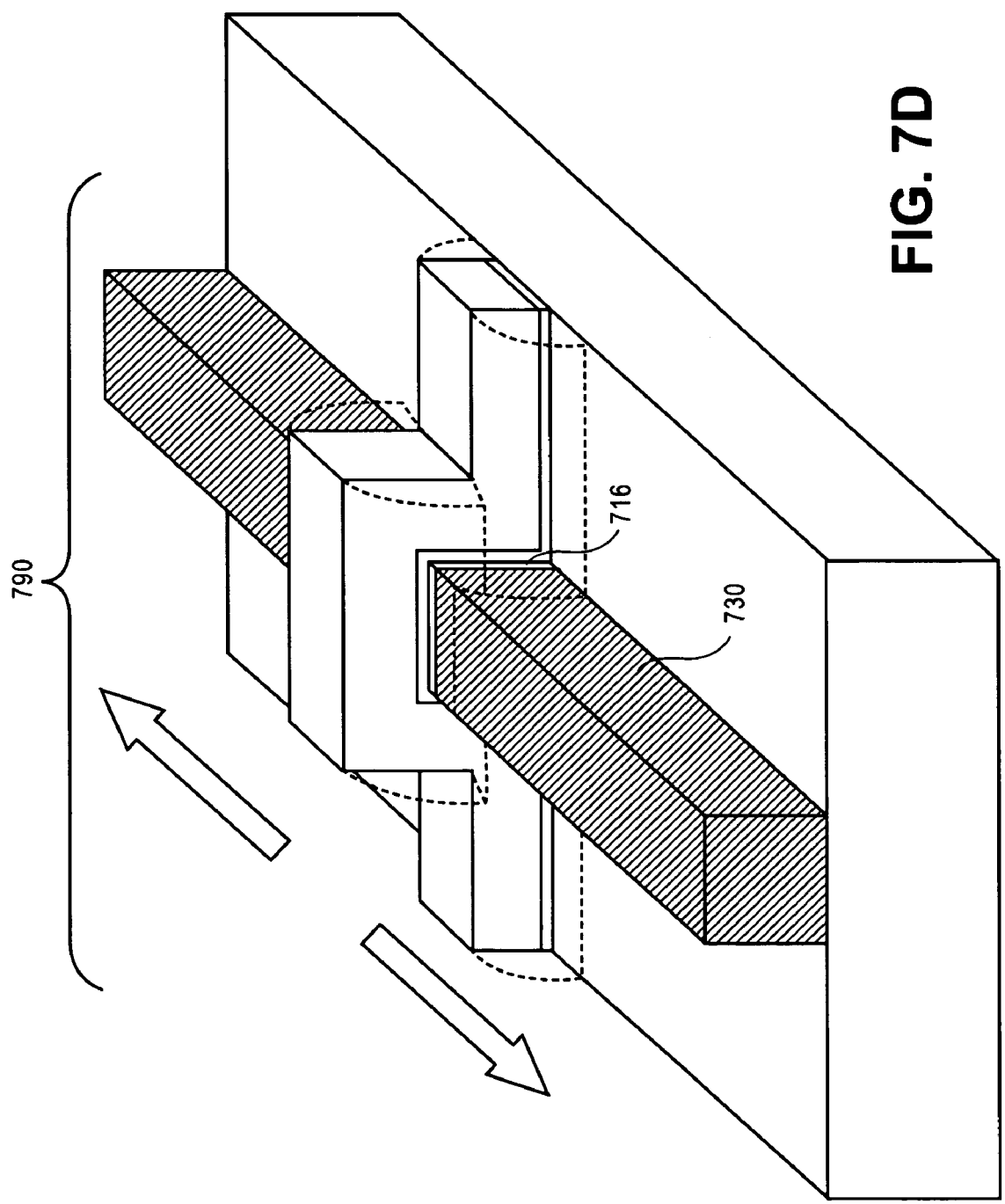

Referring to FIG. 7C, three-dimensional epitaxial region 730 may be formed selectively on three-dimensional channel structure 716. In accordance with an embodiment of the present invention, three-dimensional epitaxial region 730 is a strain-inducing semiconductor region comprising three or more species of charge-neutral lattice-forming atoms that imparts a compressive uniaxial strain to three-dimensional channel structure 716, as represented by the arrows in FIG. 7C. In another embodiment, three-dimensional epitaxial region 730 is a strain-inducing semiconductor region comprising three or more species of charge-neutral lattice-forming atoms that imparts a tensile uniaxial strain to three-dimensional channel structure 716, as represented by the arrows in FIG. 7D. In one embodiment, three-dimensional channel structure 716 is comprised of silicon, germanium or $Si_xGe_{1-x}$, where $0<x<1$, and three-dimensional epitaxial region 730 is comprised of $C_ySi_zGe_{1-y-z}$, where y, $z\neq 0$. In another embodiment, three-dimensional channel structure 716 is comprised of $Al_xGa_{1-x}As$, $In_xGa_{1-x}As$, $In_xGa_{1-x}P$ or $Al_xIn_{1-x}Sb$, where $0\leq x\leq 1$, and three-dimensional epitaxial region 730 is comprised of $Al_yGa_{1-y}As$, $In_yGa_{1-y}As$, $In_yGa_{1-y}P$ or $Al_yIn_{1-y}Sb$, where $0<y<1$.

In accordance with an embodiment of the present invention, charge-carrier dopant impurity atoms are implanted into three-dimensional epitaxial region 730 either during (i.e. in situ) or subsequent to formation of three-dimensional epitaxial region 730. In one embodiment, three-dimensional epitaxial region 730 is comprised of $C_ySi_zGe_{1-y-z}$, where y, $z\neq 0$, and the charge-carrier dopant impurity atoms implanted are selected from the group consisting of boron, arsenic, indium or phosphorus. In another embodiment, three-dimensional epitaxial region 730 is comprised of $Al_yGa_{1-y}As$, $In_yGa_{1-y}As$, $In_yGa_{1-y}P$ or $Al_yIn_{1-y}Sb$, where $0<y<1$, and the charge-carrier dopant impurity atoms implanted are selected from the group consisting of carbon, silicon, germanium, oxygen, sulfur, selenium or tellurium.

Thus, a method to form a tri-gate MOS-FET device comprising a strained three-dimensional channel structure 716 and a three-dimensional strain-inducing epitaxial region 730, comprising three or more species of charge-neutral lattice-forming atoms, has been described. In accordance with an embodiment of the present invention, three-dimensional strain-inducing epitaxial region 730 imparts a uniaxial strain to three-dimensional channel structure 716 and, in turn, strained three-dimensional channel structure 716 imparts a uniaxial strain to three-dimensional strain-inducing epitaxial region 730. In one embodiment, three-dimensional strain-inducing epitaxial region 730 comprises three or more species of charge-neutral forming atoms and has a lattice constant different from the lattice constant of strained three-dimensional channel structure 716. In accordance with an embodiment of the present invention, the tri-gate MOSFET device formed above is a tri-gate PMOS-FET device 780 having a compressive-strained three-dimensional channel structure 716, as depicted by the arrows in FIG. 7C. Thus, a tri-gate PMOS-FET with enhanced hole mobility may be formed. In accordance with another embodiment of the present invention, the tri-gate MOSFET device formed above is a tri-gate NMOS-FET device 790 having a tensile-strained three-dimensional channel structure 716, as depicted by the arrows in FIG. 7D. Thus, a tri-gate NMOS-FET with enhanced electron mobility may be formed. Tri-gate PMOS-FET 780 or tri-gate NMOS-FET 790 may subsequently be incorporated into an integrated circuit by conventional process steps, as known in the art.

Thus, a method to form a strain-inducing semiconductor region comprising three or more species of charge-neutral lattice-forming atoms has been disclosed. Formation of a strain-inducing semiconductor region comprising three or more species of charge-neutral lattice-forming atoms laterally adjacent to a crystalline substrate may result in a uniaxial strain imparted to the crystalline substrate, providing a strained crystalline substrate. In accordance with an embodiment of the present invention, a semiconductor region with a crystalline lattice of three or more species of charge-neutral lattice-forming atoms imparts a strain to a crystalline substrate, wherein the lattice constant of the semiconductor region is different from that of the crystalline substrate.

What is claimed is:

1. A semiconductor device comprising:
   a strained substrate comprising a first crystalline lattice of one or more species of charge-neutral lattice-forming atoms, said first crystalline lattice selected from the group consisting of $Al_xGa_{1-x}As$, $In_xGa_{1-x}As$, $In_xGa_{1-x}P$ and $Al_xIn_{1-x}Sb$, where $0\leq x\leq 1$; and
   a strained material region laterally adjacent to said strained substrate, said strained material region comprising a second crystalline lattice of three or more species of charge-neutral lattice-forming atoms, the lattice constant of said second crystalline lattice different from the lattice constant of said first crystalline lattice, and said second crystalline lattice selected from the group consisting of $Al_yGa_{1-y}As$, $In_yGa_{1-y}As$, $In_yGa_{1-y}P$ and $Al_yIn_{1-y}Sb$, where $0<y<1$.

2. The structure of claim 1 wherein said strained material region imparts a uniaxial strain to said strained substrate, and wherein said strained substrate imparts a uniaxial strain to said strained material region.

3. The structure of claim 1 wherein the lattice constant of said second crystalline lattice is different from the lattice constant of said first crystalline lattice by a factor of at least 0.1%.

4. The structure of claim 3 wherein the lattice constant of said second crystalline lattice is different from the lattice constant of said first crystalline lattice by a factor in the range of 0.5%-1.5%.

5. The structure of claim 1 wherein said strained substrate comprises an insulating layer.

6. The structure of claim 1 wherein said strained substrate comprises a strained channel region, and wherein said strained material region comprises a strained source/drain region.

7. The structure of claim 6 wherein said strained channel region is a buried channel.

8. The structure of claim 1, further comprising:
   a strained channel layer, wherein said strained channel layer is directly above said strained substrate, and wherein said strained material region comprises a strained source/drain region.

9. A method of forming a semiconductor device comprising:
   forming a substrate comprising a first crystalline lattice of one or more species of charge-neutral lattice-forming atoms, said first crystalline lattice selected from the group consisting of $Al_xGa_{1-x}As$, $In_xGa_{1-x}As$, $In_xGa_{1-x}P$ and $Al_xIn_{1-x}Sb$, where $0\leq x\leq 1$; and
   forming a material region comprising a second crystalline lattice of three or more species of charge-neutral lattice-forming atoms, the lattice constant of said second crystalline lattice different from the lattice constant of said first crystalline lattice, and said second crystalline lattice selected from the group consisting of $Al_yGa_{1-y}As$, $In_yGa_{1-y}As$, $In_yGa_{1-y}P$ and $Al_yIn_{1-y}Sb$, where $0<y<1$, wherein said material region imparts a uniaxial strain to said substrate, and wherein said substrate imparts a uniaxial strain to said material region.

10. The method of claim 9 wherein the lattice constant of said second crystalline lattice is different from the lattice constant of said first crystalline lattice by a factor of at least 0.1%.

11. The method of claim 10 wherein the lattice constant of said second crystalline lattice is different from the lattice constant of said first crystalline lattice by a factor in the range of 0.5%-1.5%.

12. The method of claim 9 wherein said substrate comprises an insulating layer.

13. The method of claim 9 wherein said substrate comprises a strained channel region, and wherein said material region comprises a strained source/drain region.

14. The method of claim 13 wherein said strained channel region is a buried channel.

15. The method of claim 9, further comprising:
forming a strained channel layer, wherein said strained channel layer is formed directly above said substrate, and wherein said material region comprises a strained source/drain region.

16. A method of forming a semiconductor device comprising:
forming a substrate comprising a first crystalline lattice of one or more species of charge-neutral lattice-forming atoms, said first crystalline lattice selected from the group consisting of $Al_xGa_{1-x}As$, $In_xGa_{1-x}As$, $In_xGa_{1-x}P$ and $Al_xIn_{1-x}Sb$, where $0 \leq x \leq 1$;
forming a gate dielectric layer above said substrate;
forming a gate electrode above said gate dielectric layer;
removing a portion of said substrate on either side of said gate dielectric layer and said gate electrode to form a first etched-out region and a second etched-out region in said substrate; and
forming a source region in said first etched-out region and a drain region in said second etched-out region, said source region and said drain region both comprising a second crystalline lattice of three or more species of charge-neutral lattice-forming atoms, the lattice constant of said second crystalline lattice different from the lattice constant of said first crystalline lattice, and said second crystalline lattice selected from the group consisting of $Al_yGa_{1-y}As$, $In_yGa_{1-y}As$, $In_yGa_{1-y}P$ and $Al_yIn_{1-y}Sb$, where $0<y<1$, wherein said source region and said drain region each impart a uniaxial strain to said substrate, and wherein said substrate imparts a uniaxial strain to said source region and a uniaxial strain to said drain region.

17. The method of claim 16 wherein the lattice constant of said second crystalline lattice is different from the lattice constant of said first crystalline lattice by a factor of at least 0.1%.

18. The method of claim 17 wherein the lattice constant of said second crystalline lattice is different from the lattice constant of said first crystalline lattice by a factor in the range of 0.5%-1.5%.

19. The method of claim 16 wherein said substrate comprises an insulating layer.

20. The method of claim 16 wherein said substrate comprises a strained channel region.

21. The method of claim 20 wherein said strained channel region is a buried channel.

22. The method of claim 16, further comprising:
forming a strained channel layer, wherein said strained channel layer is formed directly above said substrate.

* * * * *

UNITED STATES PATENT AND TRADEMARK OFFICE
CERTIFICATE OF CORRECTION

| | | |
|---|---|---|
| PATENT NO. | : 7,629,603 B2 | Page 1 of 1 |
| APPLICATION NO. | : 11/450744 | |
| DATED | : December 8, 2009 | |
| INVENTOR(S) | : Chui et al. | |

It is certified that error appears in the above-identified patent and that said Letters Patent is hereby corrected as shown below:

On the Title Page, Item (*) Notice: delete, "149 days" and insert -- 31 days --.

In column 12, at line 15 delete, "$0 \leqq x \leqq 1$" and insert -- $0 \leq x \leq 1$ --.

In column 12, at line 57 delete, "$0 \leqq x \leqq 1$" and insert -- $0 \leq x \leq 1$ --.

In column 13, at line 27 delete, "$0 \leqq x \leqq 1$" and insert -- $0 \leq x \leq 1$ --.

Signed and Sealed this

Seventh Day of September, 2010

David J. Kappos
*Director of the United States Patent and Trademark Office*